(12) United States Patent
Chou et al.

(10) Patent No.: US 9,460,928 B2
(45) Date of Patent: Oct. 4, 2016

(54) METHOD FOR MANUFACTURING SEMICONDUCTOR DEVICES

(71) Applicant: Macronix International Co., Ltd., Hsinchu (TW)

(72) Inventors: Chen-Han Chou, Tainan (TW); I-Chen Yang, Changhua (TW); Yao-Wen Chang, Hsinchu (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/612,359

(22) Filed: Feb. 3, 2015

(65) Prior Publication Data

US 2016/0225627 A1    Aug. 4, 2016

(51) Int. Cl.
*H01L 21/70* (2006.01)
*H01L 21/265* (2006.01)
*H01L 21/66* (2006.01)
*H01L 29/167* (2006.01)
*H01L 27/115* (2006.01)
*H01L 21/8232* (2006.01)

(52) U.S. Cl.
CPC ..... *H01L 21/26586* (2013.01); *H01L 21/8232* (2013.01); *H01L 22/20* (2013.01); *H01L 27/11521* (2013.01); *H01L 27/11568* (2013.01); *H01L 29/167* (2013.01)

(58) Field of Classification Search
CPC .................. H01L 21/26586; H01L 21/8232; H01L 21/823412; H01L 22/20; H01L 27/11521; H01L 27/11568; H01L 27/0207; H01L 29/167
USPC .......................................... 257/368; 438/200
See application file for complete search history.

(56) References Cited

U.S. PATENT DOCUMENTS

2013/0256797 A1* 10/2013 Chang ............. H01L 21/823437
257/347
2014/0162423 A1* 6/2014 Lee .................. H01L 21/26586
438/275

* cited by examiner

*Primary Examiner* — Tu-Tu Ho
(74) *Attorney, Agent, or Firm* — Finnegan, Henderson, Farabow, Garrett & Dunner LLP (57) ABSTRACT

A semiconductor device manufacturing method includes preparing a wafer having projections formed on a substrate. The projections project upward from a surface of the substrate and have a height measured from the surface of the substrate. The method further includes determining an interval distribution representing a distribution of intervals between neighboring projections and calculating an implantation angle based on the height and the interval distribution. The implantation angle is an angle between a normal direction of the substrate and an implantation direction. The method also includes implanting ions at the calculated implantation angle.

10 Claims, 10 Drawing Sheets

METHOD FOR MANUFACTURING SEMICONDUCTOR DEVICES

TECHNOLOGY FIELD

The disclosure relates to manufacturing semiconductor devices and, more particularly, to an implantation process during the manufacture of semiconductor devices.

BACKGROUND

Semiconductor devices are formed on a wafer by subjecting the wafer to a manufacturing process. In some scenarios, semiconductor devices formed on a wafer are identical, i.e., they have the same dimensions and same characteristics. However, modern semiconductor device manufacture processes may include tens of, or even hundreds of, process steps, and process variations may cause device dimension deviations. The device dimension deviations may lead to deviations in device characteristics, such as threshold voltage, $V_{th}$, or breakdown voltage, $V_{pt}$, of the semiconductor devices. Such deviations may be even larger when the size of the wafer increases or the size of the individual semiconductor devices is reduced.

SUMMARY

In accordance with the disclosure, there is provided a semiconductor device manufacturing method including preparing a wafer having projections formed on a substrate. The projections project upward from a surface of the substrate and have a height measured from the surface of the substrate. The method further includes determining an interval distribution representing a distribution of intervals between neighboring projections and calculating an implantation angle based on the height and the interval distribution. The implantation angle is an angle between a normal direction of the substrate and an implantation direction. The method also includes implanting ions at the calculated implantation angle.

Also in accordance with the disclosure, there is provided a semiconductor device including a substrate and a plurality of projections formed on the substrate. The projections project upward from a surface of the substrate. Intervals between neighboring projections are different from each other. The device further includes a plurality of doped regions formed in the substrate and between the projections. The doped regions correspond to the intervals and have different doping levels.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a method for manufacturing semiconductor devices.

Hereinafter, embodiments consistent with the disclosure will be described with reference to the drawings. Wherever possible, the same reference numbers will be used throughout the drawings to refer to the same or like parts.

Figure 1:
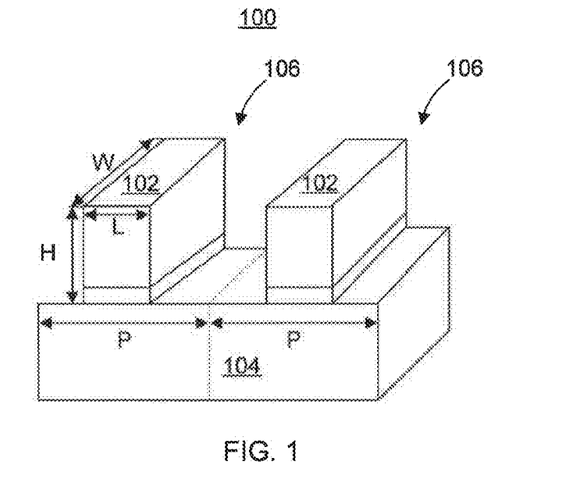
FIG. 1 is a perspective view schematically showing a portion of an exemplary wafer having projections formed on a substrate.
Figure 2A:
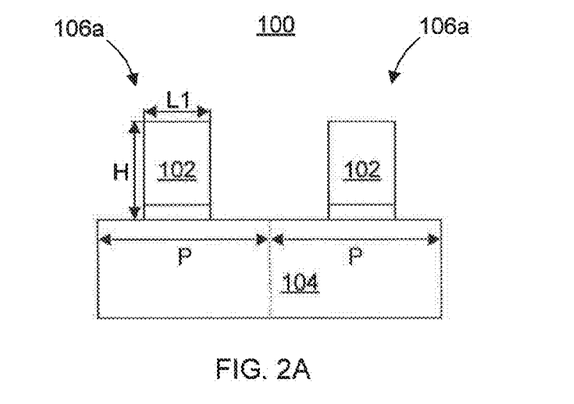
FIGS. 2A and 2B are cross-sectional views of different portions of the wafer in FIG. 1.
Figure 2B:
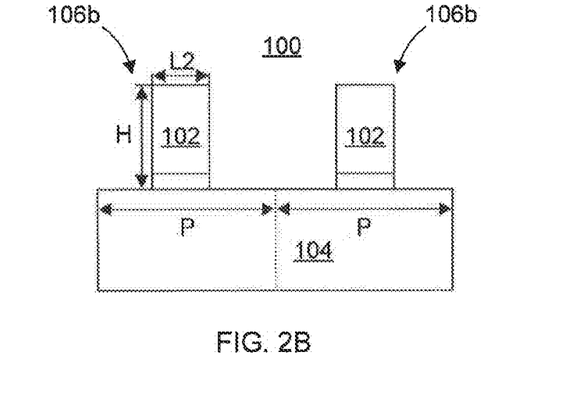

FIG. 1 is a perspective view schematically showing a portion of an exemplary wafer 100 having projections 102 formed on a substrate 104. The projections 102 are formed on the substrate 104 at a pitch P. In this example, the projections 102 are gate structures of semiconductor devices 106. The semiconductor devices 106 may be, for example, metal-oxide-semiconductor field-effect transistors (MOSFETs), charge-trap memory cells such as oxide-nitride-oxide (ONO) memory cells, or floating gate memory cells. Each of the semiconductor devices 106 is associated with multiple dimensional parameters, such as a gate length L, a gate width W, and a gate height H of the gate structure, i.e., the projection 102. Due to process variations, dimensional parameters among the semiconductor devices 106 on the wafer 100 may be different. For example, FIGS. 2A and 2B show cross-sectional views of semiconductor devices 106a and semiconductor devices 106b formed in different areas of the wafer 100 that have different gate lengths, L1 and L2, respectively. As a result, characteristics, such as electrical characteristics (e.g., threshold voltage $V_{th}$ or breakdown voltage $V_{pt}$), of the semiconductor devices 106a and those of the semiconductor devices 106b may be different.

Figure 3A:
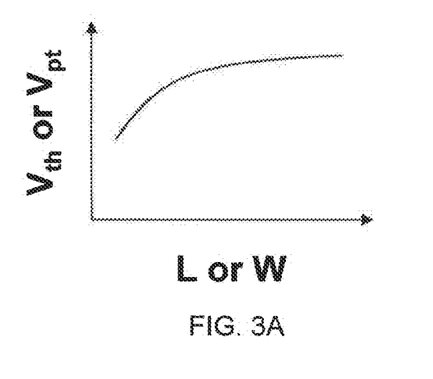
FIGS. 3A and 3B schematically illustrate relationships between a threshold voltage or a breakdown voltage and a gate length or a gate width of a semiconductor device.
Figure 3B:
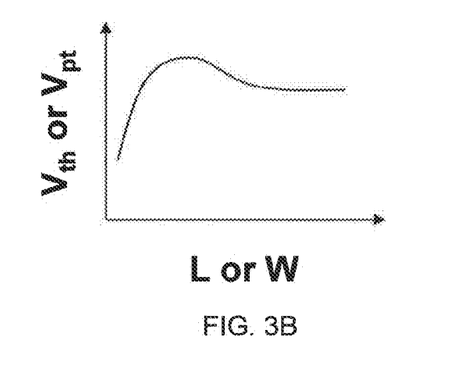

FIGS. 3A and 3B schematically illustrate relationships between $V_{th}$ or $V_{pt}$ of a semiconductor device and the gate length L or the gate width W thereof. FIGS. 3A and 3B show, as examples, scenarios with different doping levels in the substrate 104, respectively. Under the same doping conditions, a smaller device usually has lower $V_{th}$ and $V_{pt}$ as compared to a larger device, and thus the structure design margin for a smaller device is tight. Therefore, when device dimension is scaling, the electrical performance of a small device is sensitive to complex thermal diffusion and process control. Consequently, a small device has a limited operating current region that may be affected by a non-uniform doping profile. For example, a small device in a region having a high local doping level would have a larger $V_{th}$ than a small device in a region having a low local doping level. On the other hand a large device may have a wider operating current region to balance the electrical variation introduced by the non-uniform doping distribution. In FIGS. 3A and 3B, the horizontal axes represent the gate length L or the gate width W, and the vertical axes represent $V_{th}$, or $V_{pt}$. Therefore, in FIGS. 3A and 3B, each curve represents four dependence relationships: the dependence of $V_{th}$ on L, the dependence of $V_{th}$ on W, the dependence of $V_{pt}$ on L, and the dependence of $V_{pt}$ on W.

Figure 4:
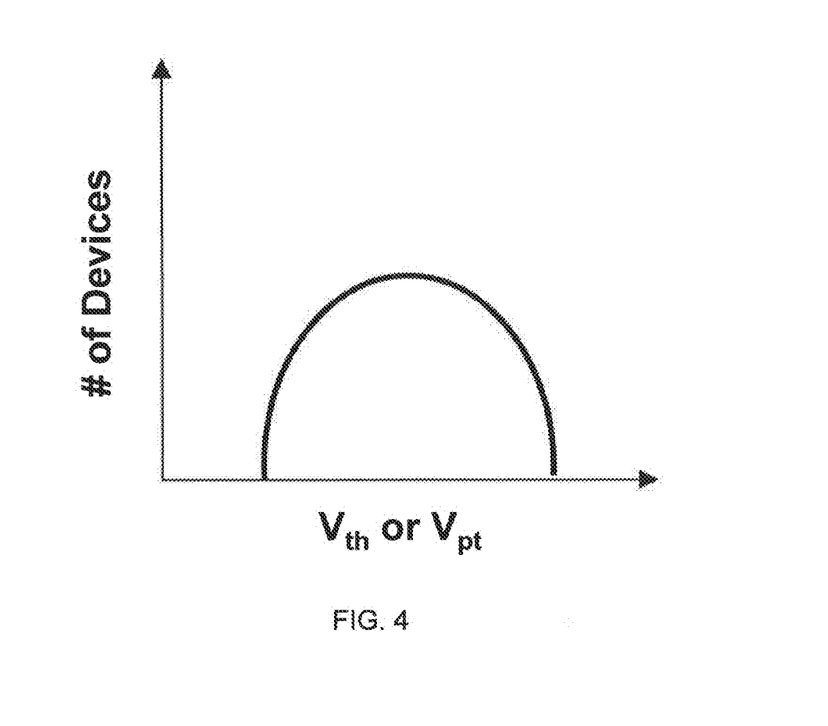
FIG. 4 schematically shows a distribution of the threshold voltage and the breakdown voltage of semiconductor devices across a wafer.

Specifically, FIG. 3A shows the scenario in which the doping level in the substrate 104 is relatively low so that a short-channel effect occurs. On the other hand, FIG. 3B shows the scenario in which the doping level in the substrate 104 is relatively high so that a reverse short-channel effect occurs. As shown in FIGS. 3A and 3B, in either of the two scenarios, both $V_{th}$ and $V_{pt}$ may vary greatly among devices with different gate length L or gate width W. Therefore, if semiconductor devices formed on different regions of the same wafer have different dimensions, such as different gate lengths as shown in FIGS. 2A and 2B, one or more device characteristics, such as $V_{th}$ or $V_{pt}$, of the semiconductor devices across the wafer, may be different, causing a device characteristic distribution, i.e., the device characteristic across the wafer is not uniform. FIG. 4 schematically shows an exemplary distribution of $V_{th}$ or $V_{pt}$. In FIG. 4, the horizontal axis represents $V_{th}$ or $V_{pt}$, and the vertical axis represents the number of devices that have a certain $V_{th}$ or $V_{pt}$. Due to process variations, this distribution may be very wide.

Figure 5A:
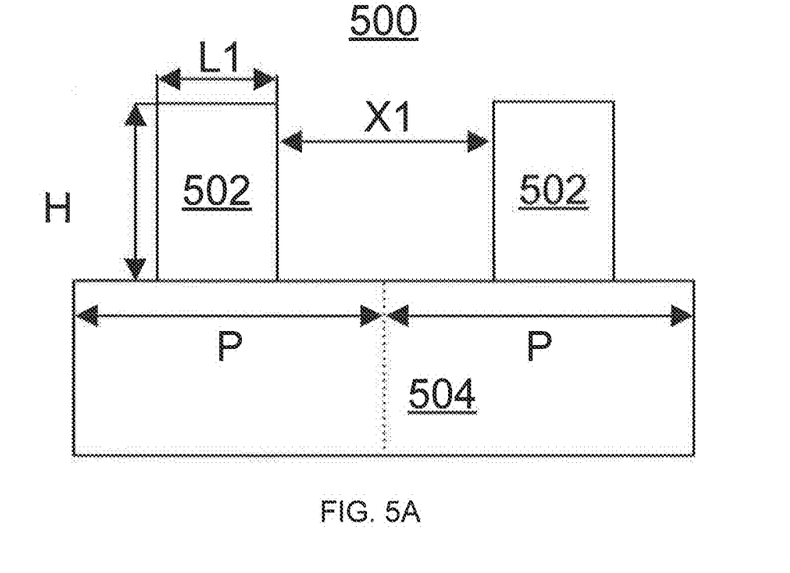
FIGS. 5A, 5B, 6A, and 6B are cross-sectional views schematically showing a semiconductor device manufacturing method according to an exemplary embodiment.
Figure 5B:
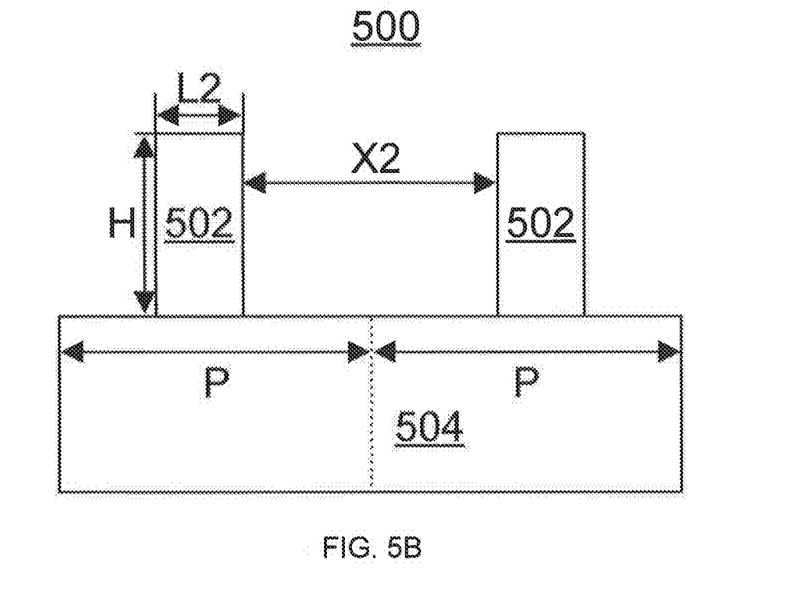

FIGS. 5A, 5B, 6A, and 6B are cross-sectional views schematically showing an exemplary method for manufacturing semiconductor devices, consistent with embodiments of the disclosure. As shown in FIGS. 5A and 5B, a wafer 500 has projections 502 formed on a substrate 504. The substrate 504 may be, for example, a semiconductor substrate, such as a silicon substrate or a silicon-on-insulator substrate. Further, the substrate 504 may be doped n-type or p-type. In some embodiments, the semiconductor devices are transistors and regions of the substrate 504 covered by the projections 502 correspond to channel regions of the transistors.

The projections 502 formed on the wafer 500 may be structures formed during the manufacturing process of semiconductor devices that are removed or destroyed in a later stage of the manufacturing process, or may be structures that remain in the final devices. In some embodiments, the projections 502 are included in a patterned layer formed of a single material, for example, a dielectric such as an oxide, a nitride, or an oxynitride, a semiconductor such as a mono-crystalline silicon or a polycrystalline silicon, a metal, or a photoresist. In some embodiments, the projections 502 are included in a patterned layer formed of at least two types of materials stacked one on another. The at least two types of materials may be chosen from, for example, the materials listed above. In some embodiments, the projections 502 are gate structures of transistors. The transistors may be, for example, MOSFETs, charge-trap memory cells such as ONO memory cells, or floating-gate memory cells.

The projections 502 are formed on the substrate 504 at the same pitch P and the same height H. FIG. 5A shows a first area of the wafer 500 where a length of the projections 502 is L1 and an interval between neighboring projections 502 is X1. FIG. 5B shows a second area of the wafer 500 where a length of the projections 502 is L2 and an interval between neighboring projections 502 is X2. In this example, L1 is larger than L2, and X1 is smaller than X2 due to the difference in length.

Figure 6A:
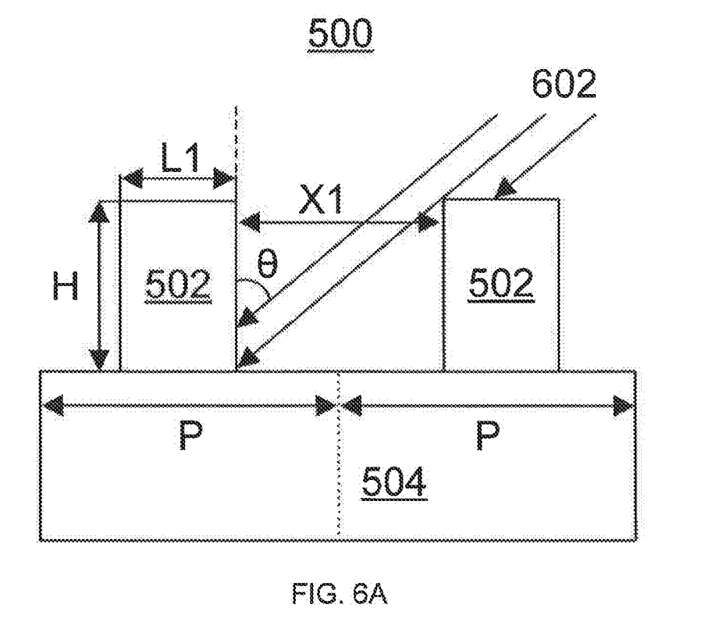
Figure 6B:
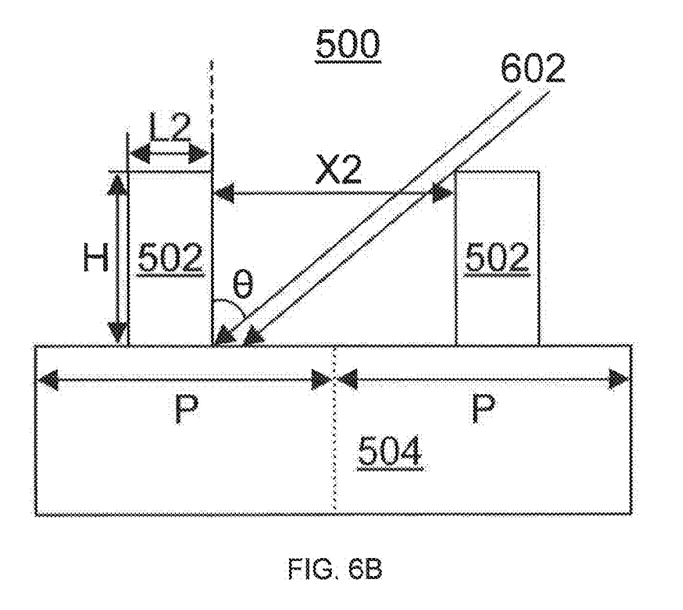

As shown in FIGS. 6A and 6B, an ion implantation is performed on the wafer 500 shown in FIGS. 5A and 5B by implanting ions 602 at an implantation angle θ. The implantation angle θ is an angle between a normal direction (indicated by dashed lines in FIGS. 6A and 6B) of the of the substrate 504 and an implantation direction (indicated by solid arrow lines in FIGS. 6A and 6B) at which the ions 602 are implanted. The ions 602 may be at least one of arsenic ions, boron ions, antimony ions, nitrogen ions, germanium ions, carbon ions, or phosphorus ions.

Consistent with embodiments of the disclosure, the implantation angle θ is chosen such that in the first area of the wafer 500 shown in FIGS. 5A and 6A, the ions 602 are completely blocked by the projections 502, and thus cannot reach a region of the substrate 504 between the neighboring projections 502. On the other hand, in the second area of the wafer 500 shown in FIGS. 5B and 6B, the ions 602 are not completely blocked by the projections 502, and thus some of the ions 602 can reach a region of the substrate 504 between the neighboring projections 502. Such a tilted implantation consistent with embodiments of the disclosure is also referred to as a self aligned implantation.

Consistent with embodiments of the disclosure, the implantation angle θ is calculated based on the height H of the projections 502 and an interval distribution representing a distribution of the intervals between neighboring projections 502 across the wafer 500. The interval distribution may contain a series of interval values, such as 90 nm, 94 nm, 94 nm, 100 nm . . . , each of which corresponds to an interval between two neighboring projections. The interval distribution may also include a statistic illustrating, for each interval range, how many pairs of neighboring projections have an interval that falls in that interval range. For example, 10 pairs of neighboring projections have an interval that falls in the interval range of 90 nm to 91 nm, 20 pairs of neighboring projections have an interval that falls in the interval range of 91 nm to 92 nm, etc.

Consistent with embodiments of the disclosure, to determine the implantation angle θ, a first angle θ1 is calculated based on the height H of the projections 502 and the interval X1 between neighboring projections 502 in the first area of the wafer 500, using an equation θ1=arctan(X1/H). Similarly, a second angle θ2 is calculated based on the height H of the projections 502 and the interval X2 between neighboring projections 502 in the second area of the wafer 500, using an equation θ2=arctan(X2/H). Thus, the implantation angle θ is chosen such that θ1≤θ≤θ2.

In some embodiments, the interval X1 between neighboring projections 502 in the first area of the wafer 500 is the smallest interval in the interval distribution. In some embodiments, the interval X2 between neighboring projections 502 in the second area of the wafer 500 is the largest interval in the interval distribution. In some embodiments, X1 and X2 are the smallest and the largest intervals, respectively, in the interval distribution.

The interval distribution may be determined by various approaches. In some embodiments, after the projections 502 are formed on the substrate 504, a sample strip is cut from the wafer 500. The intervals between neighboring projections 502 on the sample strip are measured and an interval distribution on the sample strip (also referred to as a "sample interval distribution") is thus determined. The sample interval distribution is used as the interval distribution across the entire wafer 500. As one of ordinary skill in the art will now recognize, as more projections 502 are contained in the sample strip, the closer the sample interval distribution will be to the actual interval distribution on the wafer 500.

In some embodiments, historical data are used to determine the interval distribution on the wafer 500. Intervals on a wafer (or wafers) that is (are) similar to the wafer 500 and has (have) projections formed under similar conditions as those for forming the projections 502, are measured and the results are stored. An interval distribution thus determined (also referred to as a "statistical interval distribution") can be used as the interval distribution on the wafer 500.

Figure 7A:
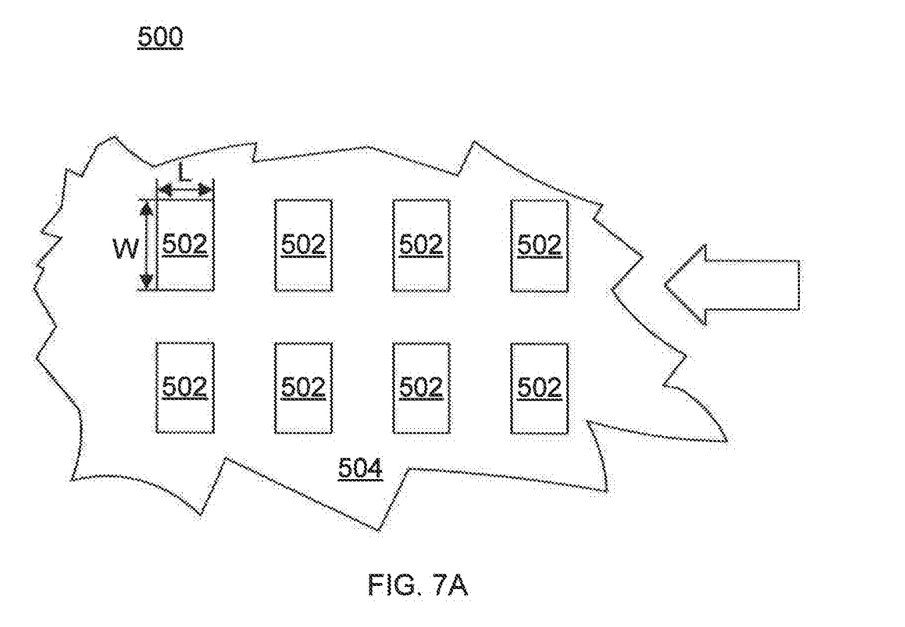
FIGS. 7A and 7B are plan views schematically showing a portion of wafer undergoing the manufacturing method shown in FIGS. 5A, 5B, 6A, and 6B.

As described above, the ion implantation consistent with embodiments of the disclosure is a tilted ion implantation. That is, the ion implantation is not performed along the normal direction of the substrate 504. The direction of the ion implantation (also referred to as ion implantation direction) therefore has two components, i.e., a horizontal direction component and a vertical direction component. The horizontal component of the ion implantation direction is schematically illustrated in the plan views of FIGS. 7A and 7B. The areas shown in FIGS. 7A and 7B may be the same portion, or different portions, of the wafer 500. In FIG. 7A, the ion implantation is performed along a length L direction of the projections 502 (as shown by the block arrow in FIG. 7A), i.e., a plane defined by the normal direction of the substrate 504 and the implantation direction is parallel to the length direction of the projections 502. This corresponds to the scenario shown in the cross-sectional views in FIGS. 5A, 5B, 6A, and 6B. In this scenario, the interval distribution represents a distribution of intervals between neighboring projections 502 along the length direction of the projections 502. In some embodiments, the length direction of the projections 502 corresponds to a bit-line direction of the wafer 500 and thus the interval distribution represents a distribution of intervals between neighboring projections 502 along the bit-line direction of the wafer 500.

Figure 7B:
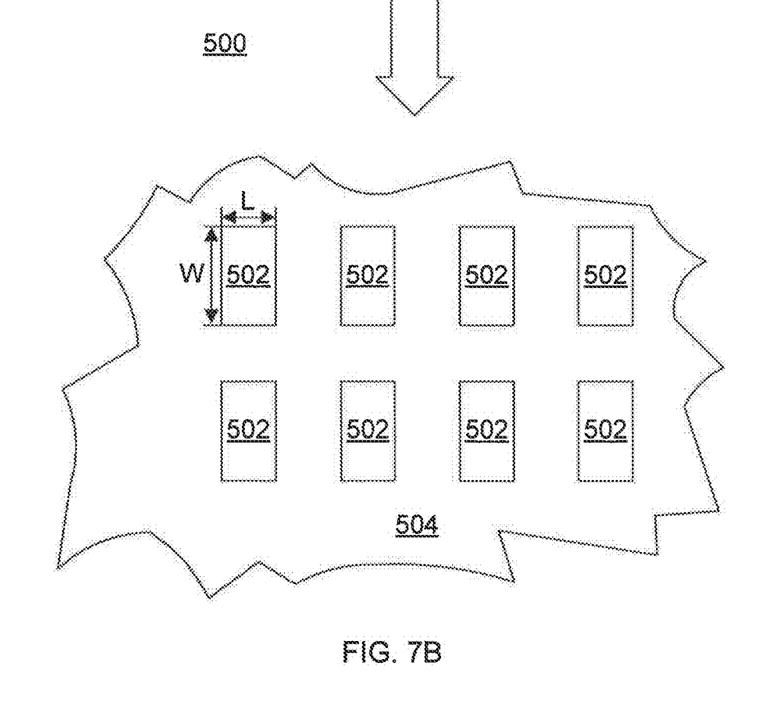

On the other hand, in FIG. 7B, the ion implantation is performed along a width W direction of the projections 502 (as shown by the block arrow in FIG. 7B), i.e., the plane defined by the normal direction of the substrate 504 and the implantation direction is parallel to the width direction of the projections 502. In this scenario, the interval distribution represents a distribution of intervals between neighboring projections 502 along the width direction of the projections 502. In some embodiments, the width direction of the projections 502 corresponds to a word-line direction of the wafer 500 and thus the interval distribution represents a distribution of intervals between neighboring projections 502 along the word-line direction of the wafer 500.

Figure 8A:
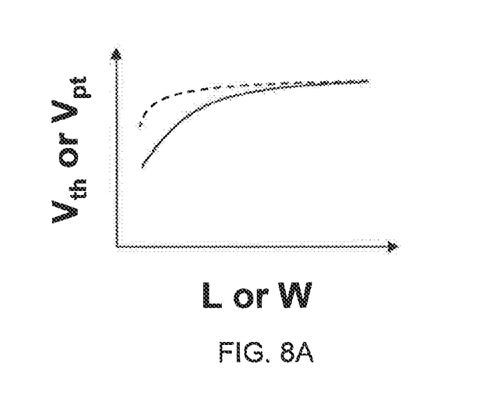
FIGS. 8A and 8B schematically illustrate effects of methods according to embodiments of the disclosure on the dependence of the threshold voltage or the breakdown voltage on the gate length or the gate width of the semiconductor device.
Figure 8B:
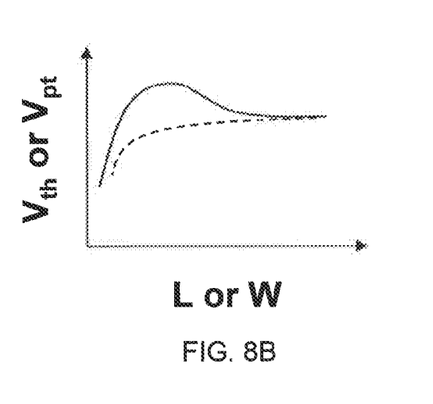

FIGS. 8A and 8B schematically illustrate the effects of the self-aligned ion implantation consistent with embodiments of the disclosure by comparing with a situation in which no such self-aligned ion implantation is performed. In FIGS. 8A and 8B, solid curves correspond to the dependence of $V_{th}$ or $V_{pt}$ of a semiconductor device on the gate length L or the gate width W thereof, which are similar to the curves shown in FIGS. 3A and 3B. On the other hand, dashed curves in FIGS. 8A and 8B correspond to the dependence of $V_{th}$ or $V_{pt}$ of a semiconductor device on the gate length L or the gate width W thereof, which is manufactured using a method consistent with embodiments of the disclosure. Similar to FIGS. 3A and 3B, each curve in FIGS. 8A and 8B represents four dependence relationships.

Figure 9:
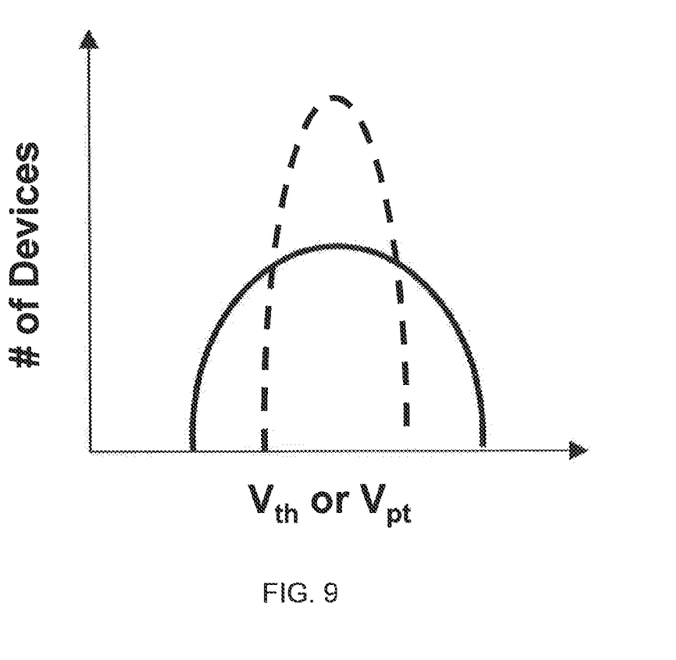
FIG. 9 schematically illustrates effects of the methods according to embodiments of the disclosure on the distribution of the threshold voltage or the breakdown voltage of semiconductor devices on a wafer.

As shown in FIGS. 8A and 8B, the dependence curves are more flattened for devices subjected to the manufacturing process consistent with embodiments of the disclosure. Therefore, with the manufacturing method consistent with embodiments of the disclosure, even if process variations cause dimension deviations, characteristics, e.g., electrical characteristics, of the final semiconductor devices are relatively more uniform across the wafer. That is, the distribution of $V_{th}$ or $V_{pt}$ on a wafer becomes narrower, as indicated by the dashed curve in FIG. 9. In FIG. 9, the solid curve represents the distribution of $V_{th}$ or $V_{pt}$ on a wafer not subjected to the manufacturing process consistent with embodiments of the disclosure, which is similar to the curve shown in FIG. 4.

Figure 10A:
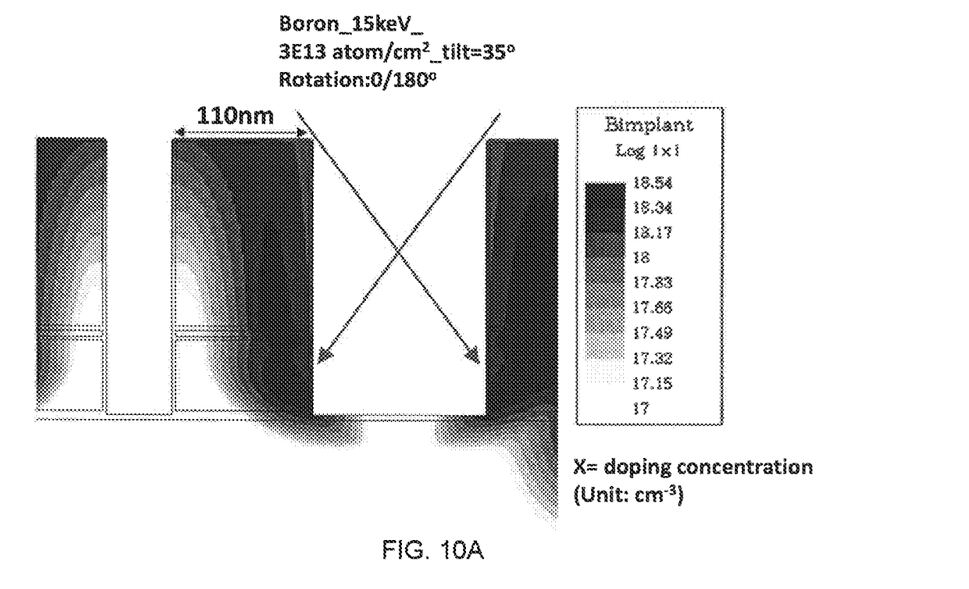
FIGS. 10A and 10B show simulated impurity distributions in different portions of a wafer after performing a self-aligned implantation according to an exemplary embodiment.
Figure 10B:
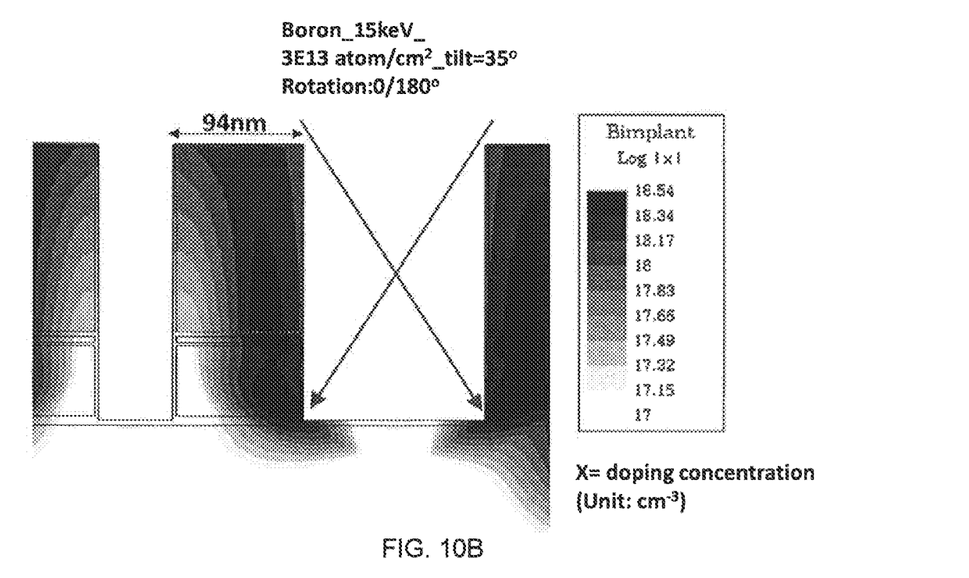

FIGS. 10A and 10B show simulated impurity distributions in a wafer after the self-aligned ion implantation consistent with embodiments of the disclosure is performed. In particular, FIG. 10A shows an area of the wafer corresponding to the first area of the wafer 500 shown in FIGS. 5A and 6A, and FIG. 10B shows an area of the wafer corresponding to the second area of the wafer 500 shown in FIGS. 5B and 6B. In FIGS. 10A and 10B, the projections are formed at the same pitch. The length of the projections in FIG. 10A is 110 nm, and the length of the projections in FIG. 10B is 94 nm. Two tilted implantations (indicated by the arrow lines in FIGS. 10A and 10B) are performed, one from the left side and one from the right side, by implanting boron ions at a dose of 3E13 atom/cm$^2$ and an implantation angle of 35°. In the area shown in FIG. 10A, the ions are blocked by the projections. On the other hand, in the area shown in FIG. 10B, since the projections cannot completely block the ions, the ions are implanted into the region of the substrate between the projections and the impurity distribution in that region is modified. It is noted, however, that even in FIG. 10A, some ions still enter the region of the substrate between the projections. This is not due to ions being implanted into that region, but because of, for example, the diffusion spread of ions into that region after being implanted into the projections.

Figure 11A:
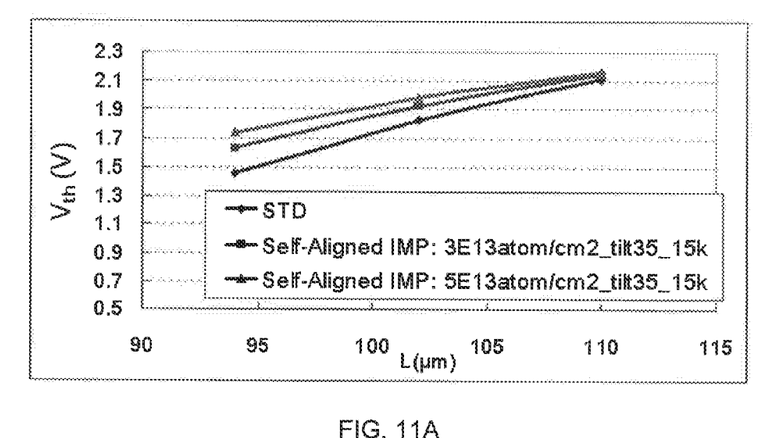
FIGS. 11A and 11B show simulated threshold voltage and breakdown voltage of devices having different gate lengths.
Figure 11B:
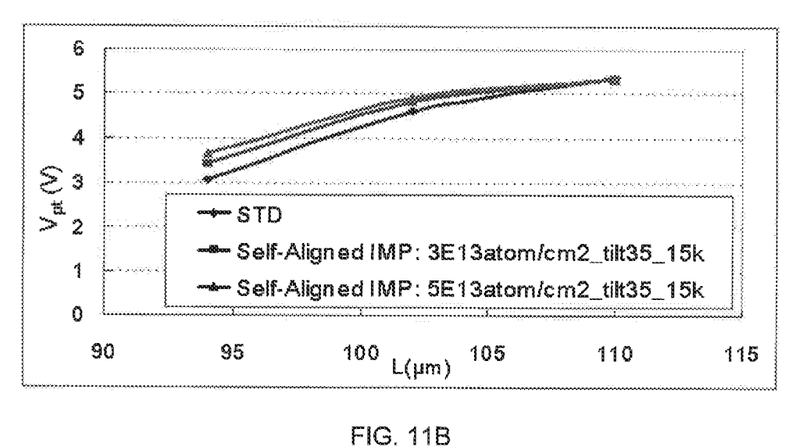

FIGS. 11A and 11B show simulated electrical characteristics, $V_{th}$ and $V_{pt}$, respectively, of semiconductor devices having different gate lengths. In FIGS. 11A and 11B, curves with diamond points represent the results for semiconductor devices not subjected to the self-aligned implantation consistent with embodiments of the disclosure; curves with square points represent the results for semiconductor devices subjected to the self-aligned implantation at an implantation angle of 35° and a dose of 3E13 atom/cm$^2$; and curves with triangle points represent the results for semiconductor devices subjected to the self-aligned implantation at an implantation angle of 35° and a dose of 5E13 atom/cm$^2$. As shown in FIGS. 11A and 11B, with the self-aligned implantation consistent with embodiments of the disclosure, both $V_{th}$ and $V_{pt}$ are more uniform among devices having different dimensions, e.g., different gate lengths, i.e., both $V_{th}$ roll-off and $V_{pt}$ roll-off are suppressed.

Figure 12A:
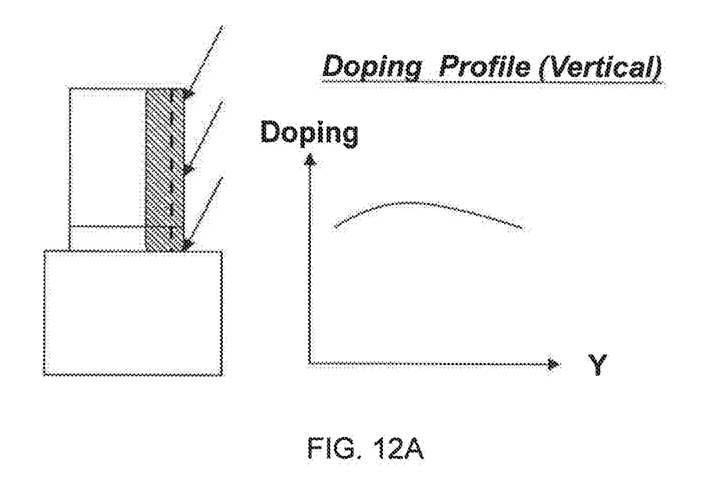
FIGS. 12A and 12B schematically show a comparison between vertical doping profiles in projections subjected to a tilted ion implantation according to embodiments of the disclosure and in projections subjected to a vertical ion implantation.
Figure 12B:
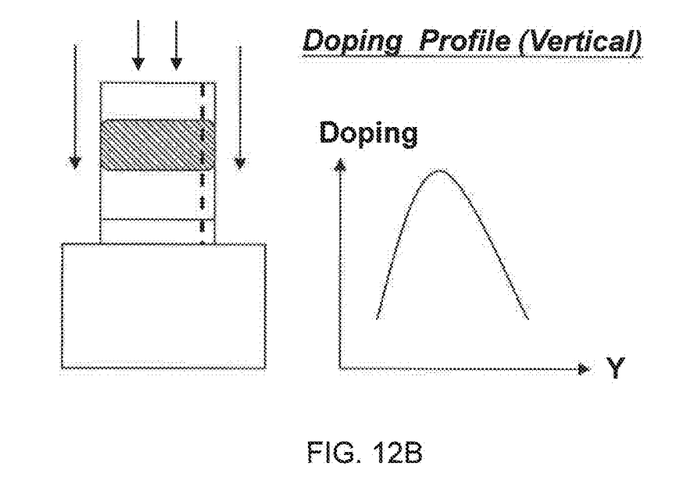

FIGS. 12A and 12B schematically show a comparison between a vertical doping profile in a projection, such as a gate structure, formed in a wafer subjected to a tilted ion implantation consistent with embodiments of the disclosure (FIG. 12A) and a vertical doping profile in a projection of a wafer subjected to a vertical ion implantation (FIG. 12B). The arrow lines represent directions of ion implantations. In FIGS. 12A and 12B, letter "Y" in the horizontal axis of each profile plot represents a vertical position in the projection. The doping level is measured along the vertical dashed lines shown in FIGS. 12A and 12B. As shown in FIG. 12A, for a wafer subjected to a tilted ion implantation consistent with embodiments of the disclosure, the implanted ions are mainly contained in a region (the region with diagonal hatch lines) of the projection close to a side face of the projection that receives the implantation. In such a scenario, the vertical doping profile in the projection is relatively flat. On the other hand, as shown in FIG. 12B, for a wafer not subjected to a tilted ion implantation but a vertical ion implantation, the implanted ions are mainly contained in a region (the region with diagonal hatch lines) "buried" in the projection and horizontally across the projection from one side face to another side face. The depth and width of the "buried" region depend on, for example, the energy of the implantation, the type of the implanted ions, and the material of the projection. In such a scenario, the vertical doping profile in the projection changes steeply. Thus, by measuring the vertical doping profile in the projection of a device, one may determine whether a tilted ion implantation consistent with embodiments of the disclosure has been performed during manufacturing of the device.

Figure 13:
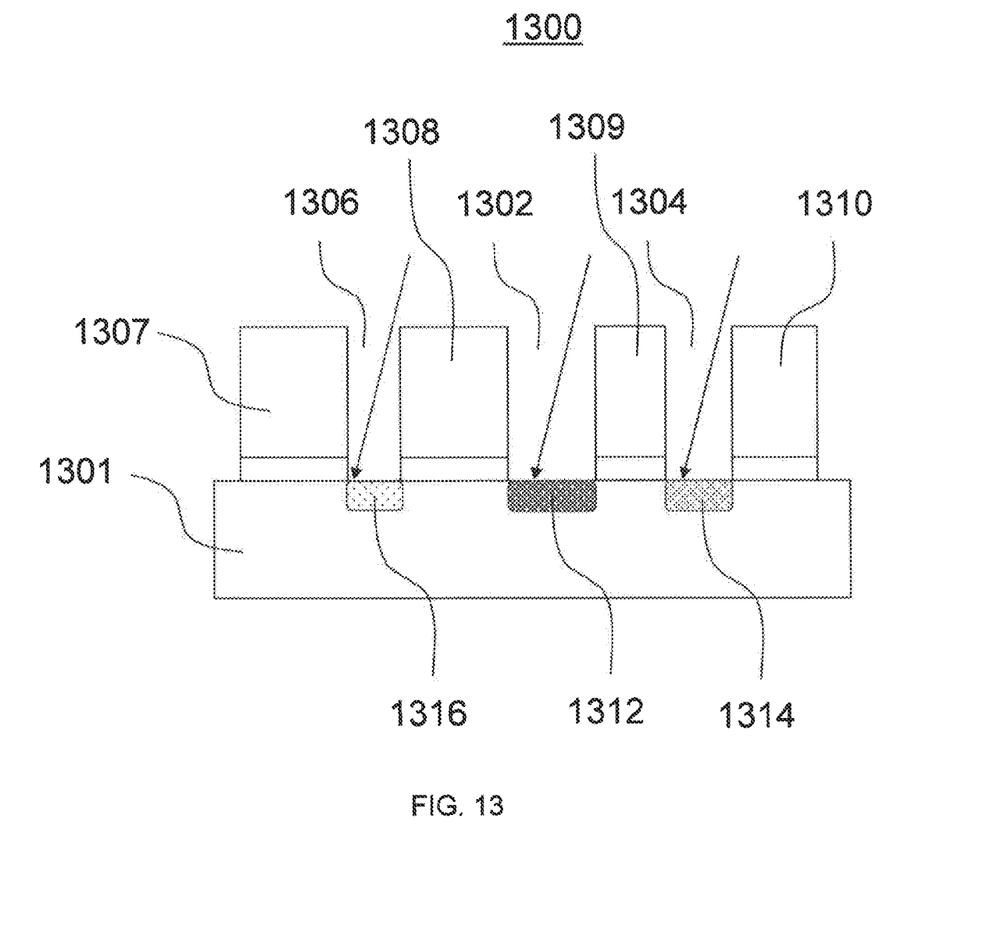
FIG. 13 schematically shows a semiconductor device according to an exemplary embodiment, illustrating different doping levels in regions between pairs of neighboring projections that have different intervals.

FIG. 13 schematically shows an exemplary device 1300 consistent with embodiments of the disclosure. The device 1300 is formed on a substrate 1301 by a method consistent with embodiments of the disclosure, such as one of the methods described above. In particular, during the fabrication of the device 1300, the substrate 1301 is subjected to the tilted ion implantation consistent with embodiments of the disclosure.

As shown in FIG. 13, the device 1300 includes intervals 1302, 1304, and 1306 formed between projections 1307, 1308, 1309, and 1310 formed on the substrate 1301. In some embodiments, the projections 1307, 1308, 1309, and 1310 have approximately the same heights, and the intervals 1302, 1304, and 1306 are different from each other. The intervals 1302, 1304, and 1306 correspond to regions 1312, 1314, and 1316, respectively, formed in the substrate 1301 and between neighboring ones of the projections 1307, 1308, 1309, and 1310.

For example and without limitation, in FIG. 13, the interval 1302 is larger than the interval 1304, which is in turn larger than the interval 1306. Thus, a width of the region 1312 is larger than a width of the region 1314, which is in turn larger than a width of the region 1316. As a result of the tilted ion implantation, the region 1312 corresponding to the interval 1302 has a highest doping level, the region 1314 corresponding to the interval 1304 has a medium doping level, and the region 1316 corresponding to the interval 1306 has a lowest doping level. As one of ordinary skill in the art will now recognize, if a tilted ion implantation consistent with embodiments of the disclosure is not performed, i.e., either no ion implantation is performed or a vertical ion implantation is performed, the doping levels in the regions 1312, 1314, and 1316 would be approximately the same as each other.

Other embodiments of the disclosure will be apparent to those skilled in the art from consideration of the specification and practice of the invention disclosed herein. It is intended that the specification and examples be considered as exempla only, with a true scope and spirit of the invention being indicated by the following claims.

What is claimed is:

1. A semiconductor device comprising:
   a substrate;
   a plurality of projections formed on the substrate, the projections projecting upward from a surface of the substrate, the projections being arranged at a same pitch, and intervals between neighboring projections being different from each other; and
   a plurality of doped regions formed in the substrate and between the projections, the doped regions corresponding to the intervals and having different doping levels.

2. The semiconductor device of claim 1, wherein the doping levels in the doped regions are proportional to the intervals.

3. The semiconductor device of claim 1, wherein the projections have approximately same heights.

4. The semiconductor device of claim 1, wherein the projections include gate structures of transistors.

5. The semiconductor device of claim 1, wherein the projections belong to a patterned layer.

6. The semiconductor device of claim 5, wherein the patterned layer includes a patterned layer of a single material.

7. The semiconductor device of claim 5, wherein the patterned layer includes a patterned layer of stacked materials.

8. The semiconductor device of claim 1, wherein the projections are arranged along a word-line direction of the device.

9. The semiconductor device of claim 1, wherein the projections are arranged along a bit-line direction of the device.

10. The semiconductor device of claim 1, wherein the doped regions are doped with at least one of arsenic ions, boron ions, indium ions, antimony ions, nitrogen ions, germanium ions, carbon ions, or phosphorus ions.

* * * * *